(12) United States Patent
Schwartz

(10) Patent No.: US 8,837,195 B2
(45) Date of Patent: Sep. 16, 2014

(54) SYSTEMS AND METHODS FOR READING FERROELECTRIC MEMORIES

(71) Applicant: Palo Alto Research Center Incorporated, Palo Alto, CA (US)

(72) Inventor: David Eric Schwartz, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 63 days.

(21) Appl. No.: 13/626,840

(22) Filed: Sep. 25, 2012

(65) Prior Publication Data

US 2014/0085962 A1     Mar. 27, 2014

(51) Int. Cl.
*G11C 11/22*     (2006.01)

(52) U.S. Cl.
USPC .......................................... 365/145; 365/149

(58) Field of Classification Search
CPC ....................................................... G11C 11/22
USPC .......................................................... 365/145
See application file for complete search history.

(56) References Cited

U.S. PATENT DOCUMENTS

| | | | | |
|---|---|---|---|---|
| 3,094,686 A * | 6/1963 | Hoffman | ........................ | 365/145 |
| 5,818,238 A * | 10/1998 | DeVilbiss | ...................... | 324/537 |
| 6,114,861 A * | 9/2000 | Takeo | ............................ | 324/658 |
| 6,238,933 B1 * | 5/2001 | Sun et al. | .......................... | 438/3 |
| 6,246,602 B1 * | 6/2001 | Nishimura | ..................... | 365/145 |
| 6,327,558 B1 * | 12/2001 | Nishimura | ....................... | 703/20 |
| 6,392,919 B1 * | 5/2002 | Higgins et al. | ................ | 365/145 |
| 7,990,749 B2 * | 8/2011 | Evans, Jr. | ...................... | 365/145 |

OTHER PUBLICATIONS

Naber et al., "Organic nonvolatile memory devices based on ferroelectricity," Adv. Mater. 22, 2010, pp. 933-945.

* cited by examiner

*Primary Examiner* — Son Mai

(74) *Attorney, Agent, or Firm* — Ronald E. Prass, Jr.; Prass LLP

(57) ABSTRACT

A system and method are provided for reading ferroelectric memories in a manner that does away with a conventional requirement for inclusion of a charge or sense amplifier associated with each ferroelectric memory cell. Simple circuits are employed for modulating an AC signal that is generated and input, including wirelessly, to the circuits where a capacitance of a ferroelectric capacitor acts as a filter. Depending upon whether the ferroelectric memory (capacitor) is charged or discharged, it will have a different capacitance, which will affect the impedance that the signal sees. An ability to remotely read that signal difference, as an indication of capacitance, rather than an indication of charge, is provided to expand the use of ferroelectric memories to a broader spectrum of applications including use in RFID tags.

20 Claims, 5 Drawing Sheets

SYSTEMS AND METHODS FOR READING FERROELECTRIC MEMORIES

This application is related to U.S. patent application Ser. No. 13/626,844, entitled "Systems and Methods for Writing and Non-Destructively Reading Ferroelectric Memories," filed on a same day as this application, the disclosure of which is hereby incorporated by reference herein in its entirety.

BACKGROUND

1. Field of the Disclosed Embodiments

This disclosure relates to systems and methods for reading ferroelectric memories and particularly systems and methods that employ high frequency alternating current (AC) signals for wirelessly and remotely reading ferroelectric memories avoiding a need for a conventional charge or sense amplifier as part of a memory cell to support the memory readout.

2. Related Art

Ferroelectric memories are non-volatile electric memory components that store information as remnant polarization in a ferroelectric material. A wide variety of usable ferroelectric materials exist. Often, the ferroelectric materials in ferroelectric memories are provided in the form of ferroelectric polymers including, for example, poly(vinylidenefluoride-co-trifluoroethylene) or P(VDF-TrFE), which tend to be very attractive in many ferroelectric memory applications based on the ease with which they can be physically manipulated and the ease with which the ferroelectric properties can be modified. Devices employing ferroelectric memories tend to have comparatively lower power usage and faster write performance than those using other memory technologies. These devices tend to support a greater maximum number of write-erase cycles. Also, these devices can be formed as printed circuits. These advantages are balanced against certain disadvantages including lower storage densities, storage capacity limitations, and higher costs.

Typically, the ferroelectric capacitor constitutes an electronic device in which the ferroelectric material is sandwiched between two electrodes to form the capacitor, with the ferroelectric material as the dielectric. In a simple, straightforward and conventionally-employed configuration, the ferroelectric capacitor will be in a parallel plate configuration, but other varied structures are possible and are often implemented.

Ferroelectric materials are characterized by having remnant polarization after an electric field has been applied and removed. A ferroelectric material has a nonlinear relationship between the applied electric field and the apparent stored charge. Specifically, the ferroelectric characteristic has the form of a hysteresis loop, which is very similar in shape to the hysteresis loop of ferromagnetic materials. FIG. 1 shows the typical hysteresis 100 of the polarization when a positive and negative electric field is applied across a ferroelectric capacitor. Hysteresis loops associated with ferroelectric materials show that typically when a positive or negative electric field is applied across ferroelectric materials such as in a ferroelectric capacitor, a particular polarization response results. If the applied electric field is of a sufficient magnitude, the capacitor will retain its polarization even after the field is removed. The ferroelectric capacitor is bistable, with two different polarizations possible when no electric field is applied. These can be used to represent the values "1" (see element 110 in FIG. 1) and "0" (see element 120 in FIG. 1). These points 110,120 are the two stable points at no electric field representing the values "1" and "0" of a 1-bit memory element for a ferroelectric memory. For a more detailed discussion, see Naber et al., "Organic nonvolatile memory devices based on ferroelectricity," Adv. Mater. 22, 2010, pp. 933-45 (hereinafter "Naber"), which is incorporated herein by reference describing the state of the art in ferroelectric memories in organic nonvolatile memory devices.

A bit of data is written to the ferroelectric memory by applying a bias across the ferroelectric material. A positive bias may write one state ("1") value and a negative bias may write another state ("0") value, or vice versa depending on a polarization of a ferroelectric memory. When an external electric field is applied across a dielectric, the dipoles tend to align themselves with the field direction, produced by small shifts in the positions of atoms and shifts in the distributions of electronic charge in the crystalline structure. After the charge is removed, the dipoles retain their polarization state. The binary values of "0" and "1" are thus stored as one of two possible electric polarizations in each ferroelectrically-based data storage cell.

In a typical configuration, data is stored according to a binary polarization state of the ferroelectric capacitor, as described above. Writing to the cells is typically accomplished by (1) applying a positive bias across the ferroelectric capacitor to write a "1", or (2) applying a negative bias across the ferroelectric capacitor to write a "0". Reading from the cells is typically accomplished by applying a negative bias across the ferroelectric capacitor and measuring the amount of charge released by the capacitor. This charge may be measured using one of a sense amplifier or a charge integrator, either of which may be used to convert the charge into a large voltage. The amount of charge measured depends on the polarization state held by the ferroelectric capacitor, with a larger charge magnitude corresponding to a "1" state and a smaller charge magnitude corresponding to a "0" state. It is important to note that the above description refers to the cell having "held" a charge, because the reading process is destructive. After the reading process, the cell typically always holds a "0" value. Once the cell has been read, if the cell held a "1," the cell must be re-charged to that value again. Also, those of skill in the art recognize that, as used in the above discussion, the designations of "positive," "negative," "1," and "0," and their relationships to one another are arbitrarily assigned and that other combinations are appropriate.

SUMMARY OF THE DISCLOSED EMBODIMENTS

Common to the conventional reading processes is the presence of, and requirement for, a charge or sense amplifier as a separate component of the printed circuit that constitutes the memory cell. Despite the many available variations of charge-sensing readouts, all of these variations share the feature of requiring a precision charge or sense amplifier. In certain situations, the presence of a charge or sense amplifier is undesirable. The required inclusion of the charge or sense amplifier in the charge-sensing cell circuitry adds cost to the memory cell that is comparatively significant. Further, charge or sense amplifiers cannot be fabricated in many low-cost and large-area electronic technologies, such as with printed circuits including organic thin-film transistors. For example, it is impractical to include a charge or sense amplifier in an RFID tag using a printed organic semiconductor process. It is also impractical to include a charge or sense amplifier in a circuit disposed on a flexible substrate. Finally, it is not conventionally possible for a charge or sense amplifier to read a ferroelectric memory cell remotely. On this last point, and simply put, there is no conventional manner by which to remotely, or wirelessly, read a ferroelectric memory.

Generally, when reading ferroelectric memories using silicon electronics, a very small charge from the memory can be read without significant difficulty. This is facilitated through the use of the very sensitive (low noise) amplifier, which is easy to produce using silicon electronics, to read the relatively small charge. By contrast, when organic electronics (semiconductors) are used, it is substantially impossible to produce such a sensitive low noise amplifier. This disadvantage in the use of organic electronics and a desire to employ organic semiconductors to read ferroelectric memories combine to require a novel approach in the way that ferroelectric memories are read.

In view of the broad array of applications in which ferroelectric memories are finding common use, it would be advantageous to develop systems and methods implementing wireless reading of the ferroelectric memories and also to develop systems and methods that may expand the use of organic electronics in reading ferroelectric memories. Such capabilities may enable the inclusion of ferroelectric memories in a broad array of additional more practical applications, including, but not limited to an expansion of use in RFID tags and other "near-field" applications. As a first step in this process, and in order to achieve other benefits, it would be advantageous to develop systems and methods for reading ferroelectric memories that do away with a requirement for a charge or sense amplifier as an element of the individual memory cells.

Exemplary embodiments of the systems and methods according to this disclosure may provide a capability to read a ferroelectric memory remotely using a circuit that does not require that a charge amplifier be a part of the memory cell.

Another way of viewing the hysteresis of a ferroelectric capacitor is as a change in capacitance. FIG. 2 illustrates a typical hysteresis curve 200 of the capacitance 210 of a ferroelectric capacitor. In FIG. 2, a voltage Vg 220 represents a voltage across the ferroelectric capacitor. As shown in FIG. 2, when the voltage Vg 220 equals 0, the capacitance 210 may be considered to be nearly, but not completely, independent of polarization, with a value of around 1.0 in the illustrated units (see the dotted line box at 230). In fact, it is important to note that limited capacitance differences remain with respect to different polarizations. Further analysis of the depiction in FIG. 2 reveals that, when either a positive or a negative voltage Vg 220 is applied across the ferroelectric capacitor, the capacitance 210 is even more dependent on the polarization of the voltage. For example, when a positive value for the voltage Vg 220 is applied, the capacitance may either rise to 1.3 units or drop to 0.55 units until a positive value for the voltage Vg 220 reaches 10, at which point the capacitance is set to 0.55 units in either case, and the ferroelectric memory is rewritten. See Naber.

Exemplary embodiments may employ this unique characteristic of ferroelectric memories, and their response to applied AC signals, to provide a novel manner by which to read the ferroelectric memories.

Exemplary embodiments may also employ sensitive electronics to measure the limited capacitance differences in a manner that is non-destructive to the information stored in the memory cell.

Exemplary embodiments may employ a simple circuit to uniquely measure the capacitance using an AC signal to measure the capacitance of the ferroelectric capacitor as an indication of a data value stored in the ferroelectric memory without additional electronic circuit components being wired directly to the ferroelectric memory cell beyond a simple read circuit.

Exemplary embodiments may provide a simple circuit for modulating an AC signal that is generated and input, including wirelessly to the circuit, where the capacitance of the ferroelectric capacitor acts as a filter. Depending upon whether the ferroelectric memory (capacitor) is charged or discharged, it will have a different capacitance, which will affect the impedance that the signal sees. An ability to remotely read that signal difference, as an indication of capacitance, rather than an indication of charge, may prove advantageous in employing ferroelectric memories and a broader spectrum of applications including, for example, in RFID tags. In other words, it may be advantageous to read a capacitance across a ferroelectric capacitor, rather than a charge emitted from the ferroelectric capacitor.

Exemplary embodiments may realize a larger capacitance difference when a biasing voltage is applied across the ferroelectric capacitor based on a polarization state of the ferroelectric capacitor before the biasing. Because the biasing voltage will rewrite the memory, this read method will be destructive to the information stored in the ferroelectric memory.

Exemplary embodiments may use a high frequency AC signal for reading the ferroelectric memory enabling wireless readout and avoiding a need for a conventional charge or sense amplifier to support the memory readout.

Exemplary embodiments may generate and/or measure the AC signal remotely based on the AC signal being in wireless contact with the ferroelectric capacitor through, for example, inductive coupling, capacitive coupling or other known wireless transmission means, to make the data available to a user via a receiving system.

Exemplary embodiments may be particularly adapted for use in printed electronic circuits and organic electronics (semiconductors) in these circuits.

Exemplary embodiments may be particularly adapted for circuits disposed on flexible substrates.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods for using a high frequency AC signal for reading a ferroelectric memory, including wirelessly and remotely reading a ferroelectric memory, and avoiding a need for a conventional charge or sense amplifier to support the memory readout, will be described, in detail, with reference to the following drawings, in which.

DETAILED DESCRIPTION OF THE DISCLOSED EMBODIMENTS

The systems and methods for using a high frequency AC signal for reading a ferroelectric memory, including wirelessly and remotely reading a ferroelectric memory, avoiding a need for a conventional charge or sense amplifier to support the memory readout, according to this disclosure will generally refer to this specific utility for those systems and methods. Exemplary embodiments described and depicted in this disclosure should not be interpreted as being specifically limited to any particular configuration of, for example, a read circuit, or a remote reading system. In fact, any advantageous use of a simple circuit to support unique reading of ferroelectric memory cells in a manner that does away with the conventional charge or sense amplifier associated with each ferroelectric memory cell in the manner presented in this disclosure is contemplated.

Specific reference to, for example, any particular memory cell configuration should be understood as being exemplary only, and not limited, in any manner, to any particular class of memory cells other than that the disclosed systems and methods are particularly adaptable to ferroelectric memory cells.

Figure 1:
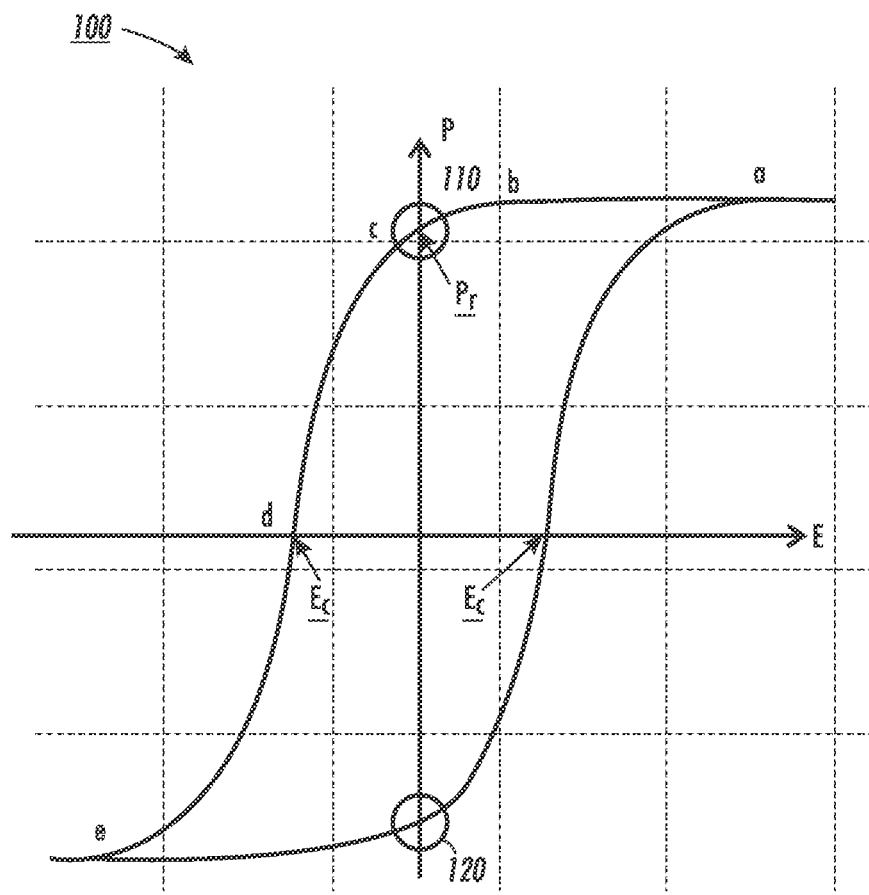
FIG. 1 illustrates a first view of a typical hysteresis of the polarization of a ferroelectric capacitor when a positive and negative electric field is applied across the ferroelectric capacitor.
Figure 2:
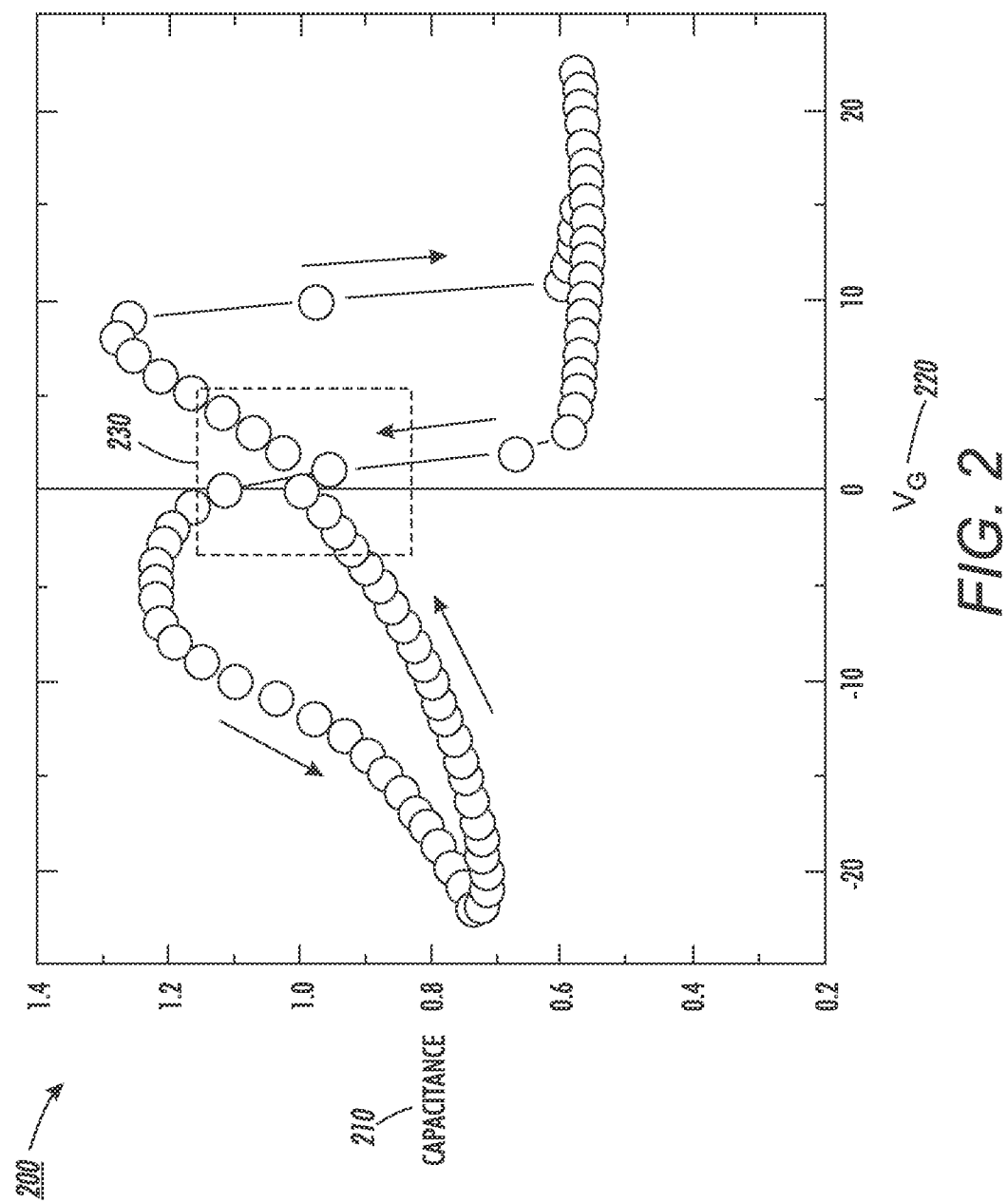
FIG. 2 illustrates a second view of a typical hysteresis curve of the capacitance of a ferroelectric capacitor.
Figure 3:
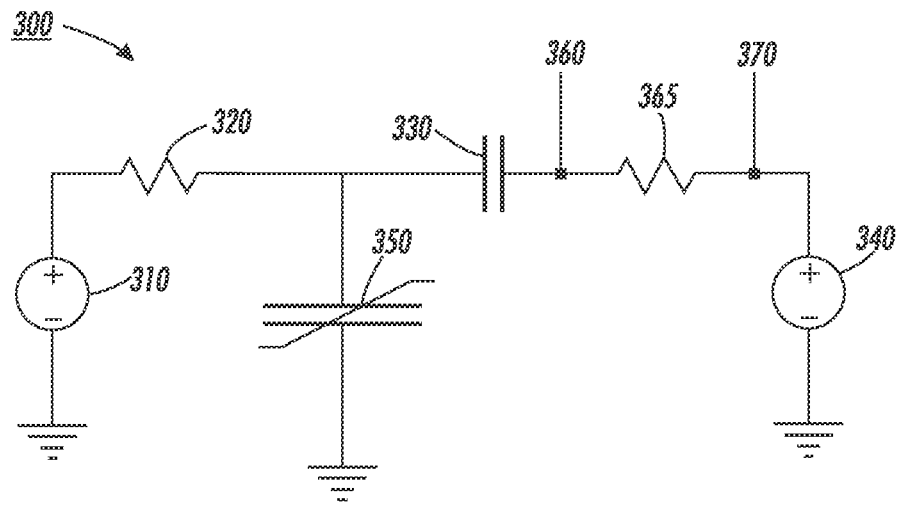
FIG. 3 illustrates a first exemplary embodiment of a circuit for writing information to, and reading information from, a ferroelectric memory according to this disclosure.
Figure 4:
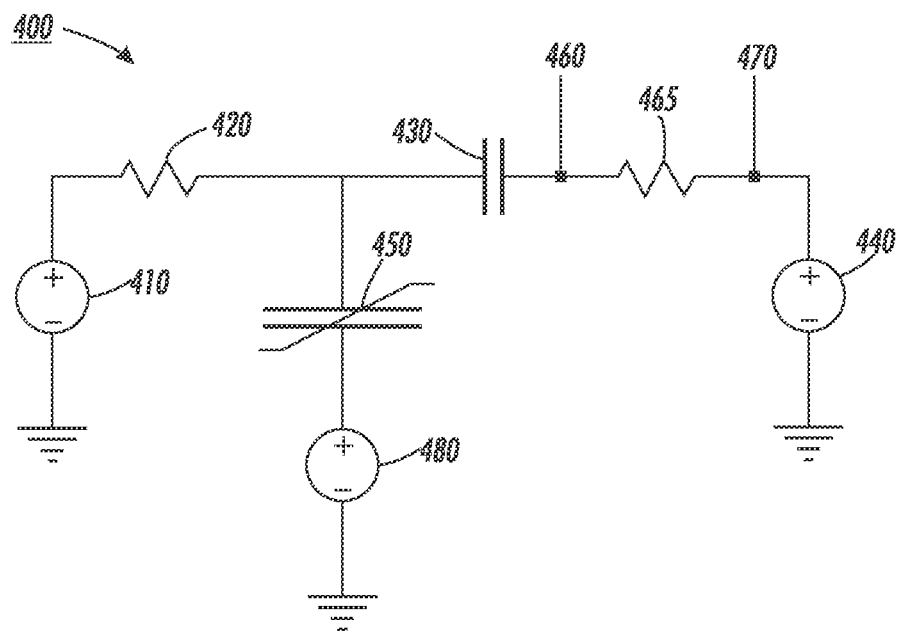
FIG. 4 illustrates a second exemplary embodiment of a circuit for writing information to, and reading information from, a ferroelectric memory according to this disclosure.

FIG. 3 illustrates a first exemplary embodiment of a circuit 300 for writing information to, and reading information from, a ferroelectric memory according to this disclosure. FIG. 4 illustrates a second exemplary embodiment of a circuit 400 for writing information to, and reading information from, a ferroelectric memory according to this disclosure. Common numbering will be employed using 300 and 400 series numbers to a maximum extent possible for common components between the embodiments shown in FIGS. 3 and 4.

As shown in FIGS. 3 and 4, the exemplary circuits 300,400 may be used to measure the capacitance of a ferroelectric capacitor as an indication of the state value of the ferroelectric capacitor using an AC signal in the following manner.

In exemplary circuits 300,400 the potential to write or read the ferroelectric capacitors 350,450 may be applied using a single direct current voltage source 310, or multiple direct current voltage sources 410/480, respectively. Various combinations of these direct current voltage sources are appropriate.

In the embodiment shown in FIG. 3, the single direct current voltage source 310 should be able to switch to both positive and negative voltages.

In the embodiment shown in FIG. 4, single polarity direct current voltages may be applied on both sides of the ferroelectric capacitor 450 from multiple (first and second) direct current voltage sources 410/480.

Simultaneously, an alternating current voltage may be applied using an alternating current voltage source 340,440. The current flowing from the alternating current voltage source 340,440 may be measured in any of a number of conventional ways, such as, for example, by measuring voltages at test points (Vtest1) 370,470 and (Vtest2) 360,460 across an AC-side resistor 365,465 of a known value. Of course, if a different method of measuring the current flowing from the alternating current voltage source 340,440 is used, the AC-side resistor 365,465 may be removed from the circuit. Further, in embodiments according to this disclosure, it should be recognized that the alternating current signal from the alternating current voltage source 340,440 may be wirelessly communicated to components of the exemplary circuits 300,400 through inductive or capacitive coupling, for example. The alternating current signal may, therefore, be remotely generated and measured.

An AC-side capacitor 330,430 may block substantially all of the switching voltage emanating from the direct current voltage source 310,410 so that the switching voltage is not seen at test points (Vtest1) 370,470 and (Vtest2) 360,460, or by the alternating current voltage source 340,440. It should be recognized that, in practice, some transients of the switching voltage may get through the AC-side capacitor 330,430.

A DC-side resistor 320,420 may be employed to substantially prevent the voltage from alternating current voltage source 340,440 from affecting the direct current voltage source 310,410. Also, the presence of the DC-side resistor 320,420 may increase the impedance of the direct current voltage source 310,410/480 in order that, from the point of view of the alternating current voltage source 340,440, it does not load the circuit more than the ferroelectric capacitor 350,450.

The memory may be read by applying a switching voltage across the ferroelectric capacitor 350,450 using direct current voltage sources 310 or 410/480, respectively, while an AC signal of smaller amplitude and frequency "f" is applied by the alternating current voltage 340,440.

It should be recognized also, however, that a capacitance difference at zero bias may lead to a small difference in measured current. In embodiments, this difference is measurable in a non-destructive readout technique. To realize a larger signal difference, the bias may be switched to observe the larger capacitance at higher bias. A transient change in the AC current may be observed during switching the magnitude of the transient change being dependent on the initial polarization state for the ferroelectric capacitor 350,450.

As the state of the ferroelectric capacitor 350,450 is "switching," a capacitance of the ferroelectric capacitor 350,450 will change in the manner described above. An impedance "I" across the ferroelectric capacitor 350,450 at frequency "f" (as a function of "f" or I(f)) may be represented according to Equation 1:

$$I(f) = 1/2\pi fC \qquad \text{Equation 1}$$

where C is dependent on the polarization state of the memory.

The current supplied by alternating current voltage source 340,440 may be dependent on this impedance I in that a higher current will flow for a larger value of C. As a result, the state of the memory may be determined by measuring the current as an indication of the capacitance of the ferroelectric capacitor 350,450, and therefore, an indication of the polarization state of the ferroelectric capacitor 350,450.

Multiple memory cells may be written to and read from independently where either side of the memory cell is connected through a transmission gate or pass transistor that can be selectively turned on or off.

It will be recognized that the exemplary embodiments of the circuits 300,400, as depicted in FIGS. 3 and 4, respectively, are simple variant examples of circuits for accomplishing the writing and reading tasks for a ferroelectric memory cell according to this disclosure. A broad spectrum of variation in specific circuit design to accomplish equivalent functionality is possible and will be clearly understood to those of skill in the art.

Additional electronics and/or software based signal processing may be used to discriminate the two memory states by referencing the AC signal. The disclosed systems and methods may then be compatible with wireless readouts as the AC signal can be applied through near-field inductive coupling so that the AC signal source and current measurement devices can be remote from the ferroelectric memory. Capacitive coupling of the alternating current voltage source to the circuit is also possible.

It will be recognized by those of skill in the art that there may be tradeoffs that will be considered when designing a ferroelectric memory cell reading system implementing the disclosed scheme. For a given ferroelectric capacitor, the AC-side (coupling) capacitor of a same order of magnitude as, or larger than, at least the smaller switching capacitance. In this manner, any impedance seen by alternating current voltage source will not be dominated by the AC-side (coupling) capacitor. This preference is limited by the understanding of those skilled in the art that the larger the AC-side (coupling) capacitor, the more the signal from the direct current voltage source may be passed through to the alternating current voltage source. In like manner, it may be preferable to have the DC-side (coupling) resistor be at least one order of magnitude, or more preferably two or more orders of magnitude, greater than the AC impedance magnitude of the AC-side (coupling) capacitor at the frequency "f" of the AC signal. In this manner, the AC signal will be largely blocked by the DC-side (coupling) resistor. In particular, the DC-side (coupling) resistor may preferably be larger than the impedance magnitude of the smallest capacitance of the ferroelectric capacitor. Finally, the frequency "f" of the AC signal used should preferably be high enough that the ferroelectric switching capacitance presents a significant impedance, but not so high that parasitic capacitances and inductances unduly reduce the signal-to-noise ratio. One of skill in the art will recognize that all of these parameters can be optimized through the selection or fabrication of a proper ferroelectric capacitor as all of these parameters are dependent on the capacitances of the ferroelectric capacitor. To optimize performance, as large a ratio of capacitances between the "0" and "1" states for the ferroelectric capacitor as may be possible is desired. The ferroelectric capacitor cell should be large enough that these capacitances are larger than any individual or accumulated parasitic capacitances in the reading circuit.

It may also be preferable to switch the switching voltages from the direct current voltage source(s) with a ramp. If the switching voltage is switched too quickly, transient signals may be more likely to pass, in greater magnitude, through the alternating current side (coupling) capacitor. Conversely, if the switching voltage is switched too slowly, the ferroelectric capacitor may be reset before enough of an impedance contrast can be registered.

In experimental simulations, a ferroelectric capacitor switched at ±20 V, for example, with "0" and "1" capacitances of roughly 27.5 pF and 5 pF, a direct current side (coupling) resistor with a resistance of 1 Megaohm (MΩ), a capacitance in the alternating current side (coupling) capacitor of 8 pF, and 10 MHz AC signal with amplitude 1 V peak-to-peak were used. In alternative experimental simulations, other values were used.

The signal-to-noise ratio of any of the circuits for implementing the schemes according to this disclosure may be improved with several well-known techniques, including differential measurements, offset cancellation, and the use of signals with multiple overlaid frequencies. For example, an identical circuit can be built with a fixed capacitor with a value equal to either the "0" or "1" state value of the ferroelectric capacitor in place of the ferroelectric capacitor. The measured current in such a circuit may then be used as a baseline for comparison of the current through the circuit with the ferroelectric cell.

Figure 5:
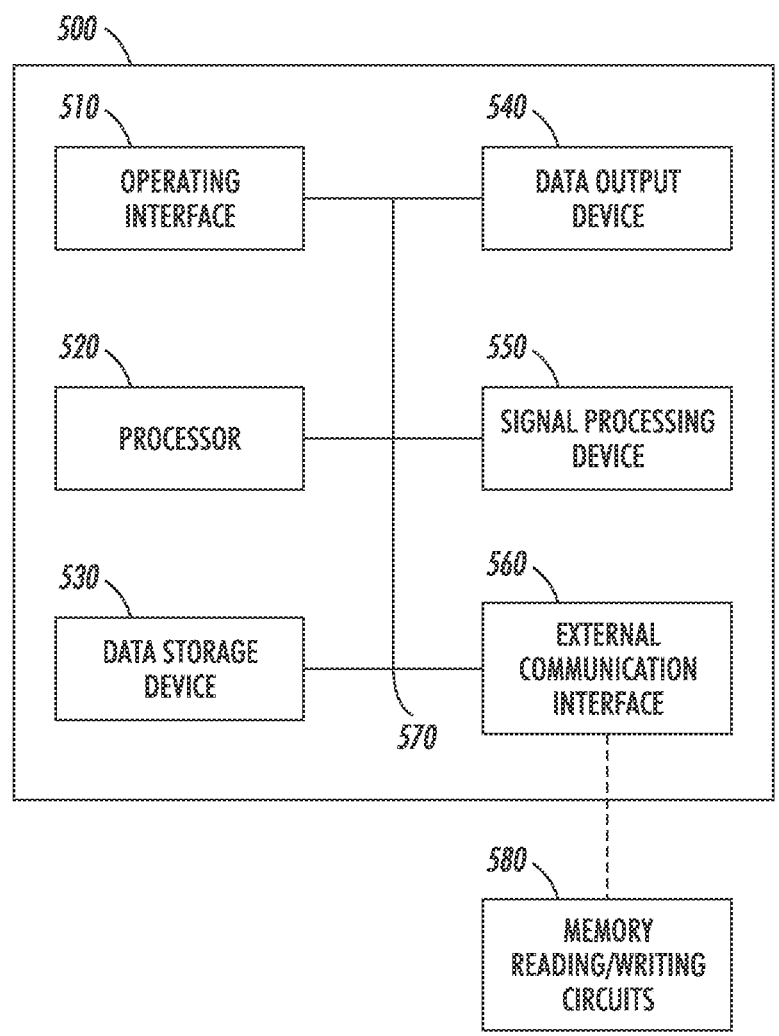
FIG. 5 illustrates a block diagram of an exemplary system for wirelessly reading information from a ferroelectric memory according to this disclosure.

FIG. 5 illustrates a block diagram of an exemplary system 500 for reading, including wirelessly reading, information from a ferroelectric memory according to this disclosure.

The exemplary system 500 may include an operating interface 510 by which a user may communicate with the exemplary system 500. The operating interface 510 may be configured as one or more conventional mechanisms common to computing devices that permit a user to input information to the exemplary system 500. The operating interface 510 may include, for example, a conventional keyboard and/or mouse/touchpad pointing system, a touchscreen with "soft" buttons or with various components for use with a compatible stylus, a microphone by which a user may provide oral commands to the exemplary system 500 to be "translated" by a voice recognition program, or other like device by which a user may communicate specific operating instructions to the exemplary system 500.

The exemplary system 500 may include one or more local processors 520 for individually operating the exemplary system 500 and for carrying out operating functions for reading ferroelectric memories by communicating with memory reading/writing circuits 580, such as the simple circuits shown in FIGS. 3 and 4, as described above, and variations thereof. Processor(s) 520 may include at least one conventional processor or microprocessor that interprets and executes instructions to direct specific functioning of the exemplary system 500. Processor(s) 520 may initiate and control the communications with, and interpretation of the data and/or signals recovered from the memory reading/writing circuits 580.

The exemplary system 500 may include one or more data storage devices 530. Such data storage device(s) 530 may be used to store data or operating programs to be used by the exemplary system 500, and specifically the processor(s) 520 in carrying out their control and data/signal interpretation functions of the exemplary system 500. Data storage device(s) 530 may be used to temporarily store data recovered from the ferroelectric memories with which the memory reading/writing circuits 580 associated with those ferroelectric memories. The data storage device(s) 530 may include a random access memory (RAM) or another type of dynamic storage device that is capable of storing updatable information, and for separately storing instructions for execution of system operations by, for example, processor(s) 520. Data storage device(s) 530 may also include a read-only memory (ROM), which may include a conventional ROM device or another type of static storage device that stores static information and instructions for processor(s) 520. Further, the data storage device(s) 530 may be integral to the exemplary system 500, or may be provided external to, and in wired or wireless communication with, the exemplary system 500.

The exemplary system 500 may include at least one data output device 540 which may be configured as one or more conventional mechanisms that output information to a user, including a digital display screen, or in combination with the operating interface 510 may represent some manner of graphical user interface or GUI. The data output device 540 may be employed, for example, to output data recovered from a ferroelectric memory in a form that is usable by a user of the exemplary system 500.

The exemplary system 500 may include a signal processing device 550 for generating an AC signal and for interpreting changes in the AC signal when in communication with the memory writing/reading circuits 580 via one or more external communication interfaces 560 by which the exemplary system 500 may communicate, including wirelessly, with the memory writing/reading circuits 580. The signal processing device 550 may operate in conjunction with the processor(s) 520 and/or the data storage device(s) 530, or as a stand-alone device, that is configured to receive signal data from the one or more external communication interfaces 560, and to convert that data into a form that is effectively processed by the exemplary system 500, for example, for display on a display screen of the data output device 540.

At least one external communication interface 560 may be configured as a data/signal communication port via which the exemplary system 500 may wirelessly communicate with a plurality of memory writing/reading circuits 580 that represent the ferroelectric memory. The wireless communications may be according to known means including, but not limited to, inductive and/or capacitive coupling. Any suitable data connection in wireless communication with a plurality of memory writing/reading circuits 580 is contemplated as being encompassed by the external data interface 560.

All of the various components of the exemplary system 500, as depicted in FIG. 5, may be connected by one or more data/control busses 570. These data/control busses 570 may provide wired or wireless communication between the various components of the exemplary system 500, whether all of those components are housed integrally in, or are otherwise external to and in communication with the exemplary system 500.

It should be appreciated that, although depicted in FIG. 5 as an integral unit, the various disclosed elements of the exemplary system 500 may be arranged in any combination of sub-systems as individual components or combinations of components, integral to a single unit, or external to, and in wired or wireless communication with other components or subsystems of the exemplary system 500. In other words, no specific configuration as an integral unit or as a support unit is to be implied by the depiction in FIG. 5. Further, although depicted as individual units for ease of understanding of the details provided in this disclosure regarding the exemplary system 500, it should be understood that the described functions of any of the individually-depicted components may be undertaken, for example, by one or more processors 520 connected to, and in communication with, one or more data storage devices 530.

Figure 6:
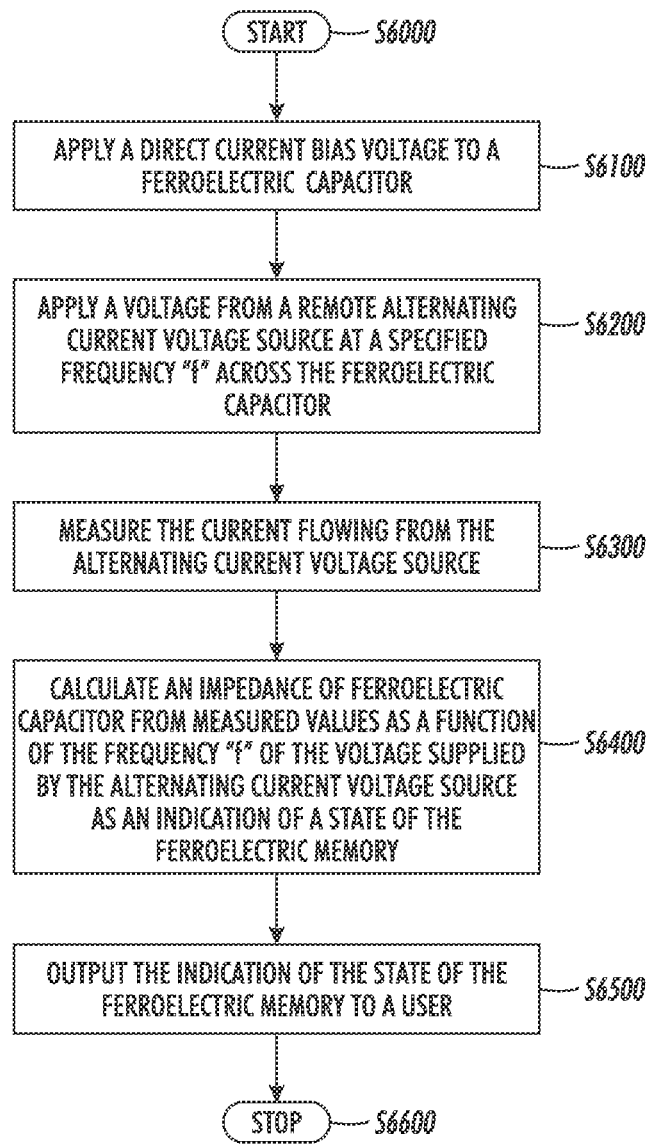
FIG. 6 illustrates a flowchart of an exemplary method for wirelessly reading information from a ferroelectric memory according to this disclosure.

The disclosed embodiments may include a method for wirelessly reading information from a ferroelectric memory. FIG. 6 illustrates a flowchart of an exemplary method for wirelessly reading information from a ferroelectric memory according to this disclosure. The exemplary method may be used to measure the capacitance of a ferroelectric capacitor as an indication of the state value of the ferroelectric capacitor using an AC signal. As shown in FIG. 6, operation of the method commences at Step S6000 and proceeds to Step S6100.

In Step S6100, a potential to write or read a ferroelectric capacitor may be applied to the ferroelectric capacitor using at least one direct current voltage source. Operation of the method proceeds to Step S6200.

In Step S6200, at the same time that the potential is being applied to the ferroelectric capacitor, an alternating current voltage signal may be applied using an alternating current voltage source. In embodiments, this alternating current voltage signal may be wirelessly communicated to the ferroelectric capacitor by known means including inductive and/or capacitive coupling. Operation of the method proceeds to Step S6300.

In Step S6300, a current flowing from the alternating current voltage source may be measured in any of a number of conventional ways, such as, for example, by measuring voltages at test points across an alternating current side resistor of a known value. Operation of the method proceeds to Step S6400.

In Step S6400, an impedance "I" across the ferroelectric capacitor at frequency "f" (as a function of "f" or I(f)) may be calculated according to Equation 1 above to derive an impedance I of the ferroelectric capacitor as an indication of the state of the ferroelectric capacitor. The current supplied by the alternating current voltage source may be dependent on this impedance I in that a higher current will flow for a larger value of C. As a result, the state of the memory may be determined by measuring the current in a simple circuit, such as the exemplary circuits 300,400 shown in FIGS. 3 and 4, and variations thereof, as described above. Operation of the method proceeds to Step S6500.

In Step S6500, displayed values indicative of the determination made by the simple circuit may be output to a user in a form that is usable by the user. Operation of the method proceeds to Step S6600, where operation of the method ceases.

The disclosed embodiments may include a non-transitory computer-readable medium storing instructions which, when executed by a processor, may cause the processor to execute all, or at least some, of the steps of the method outlined above.

The above-described exemplary systems and methods reference certain conventional components to provide a brief, general description of suitable operating, computing and communicating environments in which the subject matter of this disclosure may be implemented for familiarity and ease of understanding. Although not required, embodiments of the disclosure may be provided, at least in part, in a form of hardware circuits, firmware, or software computer-executable instructions to carry out the specific functions described. These may include individual program modules executed by a processor. Generally, program modules include routine programs, objects, components, data structures, and the like that perform particular tasks or implement particular data types in support of the overall objective of the systems and methods according to this disclosure.

Those skilled in the art will appreciate that other embodiments of the disclosed subject matter may be practiced using computing systems and memory writing/reading circuits of many different configurations. Embodiments according to this disclosure may be practiced in differing computing environments where tasks are performed by local and remote devices that may, for example, remotely read information stored in ferroelectric memories. Remotely-located devices and components may be linked to each other by hardwired links, wireless links, or a combination of both through a communication network. In a distributed computing environment, program modules may be located in both local and remote memory storage devices.

As indicated above, embodiments within the scope of this disclosure may also include computer-readable media having stored computer-executable instructions or data structures that can be accessed, read and executed by one or more processors. Such computer-readable media can be any available media that can be accessed by a processor, general purpose or special purpose computer. By way of example, and not limitation, such computer-readable media can comprise RAM, ROM, EEPROM, CD-ROM, flash drives, data memory cards or other analog or digital data storage device that can be used to carry or store desired program elements or steps in the form of accessible computer-executable instructions or data structures. When information is transferred or provided over a network or another communications connection, whether wired, wireless, or in some combination of the two, the receiving processor properly views the connection as a computer-readable medium. Thus, any such connection is properly termed a computer-readable medium. Combinations of the above should also be included within the scope of the computer-readable media for the purposes of this disclosure.

Computer-executable instructions include, for example, non-transitory instructions and data that can be executed and accessed respectively to cause a processor to perform certain of the above-specified functions, individually or in various combinations. Computer-executable instructions may also include program modules that are remotely stored for access and execution by a processor.

The exemplary depicted sequence of executable instructions or associated data structures represents one example of a corresponding sequence of acts for implementing the functions described in the steps. The exemplary depicted steps may be executed in any reasonable order to effect the objectives of the disclosed embodiments. No particular order to the disclosed steps of the method is necessarily implied by the depiction in FIG. 6, except where a particular method step is a necessary precondition to execution of any other method step.

Although the above description may contain specific details, they should not be construed as limiting the claims in any way. Other configurations of the described embodiments of the disclosed systems and methods are part of the scope of this disclosure. For example, the principles of the disclosure may be applied to each individual memory unit of a plurality of memory units. A particular user need not be operating a system, for example, that is in communication contact with all available memory units at any particular time.

It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

I claim:

1. A circuit for reading a ferroelectric memory cell, comprising:
   a ferroelectric capacitor that stores a binary polarization state representing a single data bit in a ferroelectric memory;
   an additional capacitor with a first electrode connected to a first electrode of the ferroelectric capacitor;
   a resistor connected to the first electrode of the ferroelectric capacitor;
   a capacitance of the ferroelectric capacitor being measured as an indication of the polarization state of the ferroelectric capacitor; and
   an alternating current voltage source connected to the ferroelectric capacitor via the additional capacitor applies an alternating current voltage signal to the ferroelectric capacitor,
   the capacitance of the ferroelectric capacitor being measured by referencing changes in the alternating current voltage signal.

2. The circuit of claim 1, further comprising a first direct current voltage source connected to the ferroelectric capacitor via the resistor that applies a direct current voltage signal to the ferroelectric capacitor to alter the polarization state of the ferroelectric capacitor.

3. The circuit of claim 2, further comprising a second direct current voltage source connected to a second electrode of the ferroelectric capacitor that applies a direct current voltage signal to the ferroelectric capacitor to alter the polarization state of the ferroelectric capacitor.

4. The circuit of claim 1, the ferroelectric capacitor, the additional capacitor and the resistor being printed circuit components.

5. The circuit of claim 1, the ferroelectric capacitor, the additional capacitor and the resistor being disposed on one or more flexible substrates.

6. A method of reading a ferroelectric memory, comprising:
   applying an alternating current voltage signal across a ferroelectric capacitor;
   measuring, with a processor, a capacitance of the ferroelectric capacitor by referencing changes in the alternating current voltage signal in at least one of a positive and negative polarization state for the ferroelectric capacitor;
   outputting a result of the measuring to a user as an indication of a polarization state of the ferroelectric capacitor representing a single data bit in the ferroelectric memory; and
   applying a direct current voltage signal to a ferroelectric capacitor to alter a polarization state of the ferroelectric capacitor,
   the capacitance of the ferroelectric capacitor being measured with the processor as the polarization state of the ferroelectric capacitor is altered by the direct current voltage signal.

7. The method of claim 6, the ferroelectric memory comprising a printed electronic circuit component.

8. The method of claim 6, the ferroelectric memory being disposed on one or more flexible substrates.

9. The method of claim 6, the applying the alternating current signal and the measuring the capacitance being done wirelessly.

10. The method of claim 9, the wirelessly applying the alternating current voltage signal and measuring being accomplished using at least one of inductive coupling and capacitive coupling.

11. The method of claim 6, the reading of the ferroelectric memory being non-destructive to the data stored in the ferroelectric memory before the reading.

12. The method of claim 6, the ferroelectric memory comprising a plurality of ferroelectric capacitors and coupled respective transistors as individual memory cells, the method further comprising writing or reading the individual memory cells independently by selecting the individual memory cells through activation of the coupled respective transistors for the individual memory cells.

13. The method of claim 6, further comprising applying one of more of differential or offset correction techniques to improve a signal to noise ratio in a measured alternating current signal.

14. A system that reads a ferroelectric memory, comprising:
   a ferroelectric memory comprising a cell including a ferroelectric capacitor;
   an alternating current voltage source that applies an alternating current voltage signal across the ferroelectric capacitor;
   a measuring device that measures a capacitance of the ferroelectric capacitor by referencing changes in the alternating current voltage signal in at least one of a positive and negative polarization state; and
   a direct current voltage source that applies a direct current voltage signal to the ferroelectric capacitor to alter a polarization state of the ferroelectric capacitor, the capacitance of the ferroelectric capacitor being measured as the polarization state of the ferroelectric capacitor is altered by the direct current voltage signal.

15. The system of claim 14, the ferroelectric memory comprising a printed electronic circuit component.

16. The system of claim 14, a plurality of the components of the system being disposed on one or more flexible substrates.

17. The system of claim 14, the alternating current voltage source wirelessly applying the alternating current voltage using at least one of inductive coupling and capacitive coupling.

18. The system of claim 14, the ferroelectric memory comprising a plurality of ferroelectric capacitors and associated transistors as individual memory cells, the individual memory cells being independently written or read by selecting the individual memory cells through activation of the associated transistors for each of the individual memory cells.

19. A non-transitory computer-readable medium storing instructions which, when executed by a processor, cause the processor to execute the steps of a method of reading a ferroelectric memory, comprising:

applying an alternating current voltage signal across the ferroelectric capacitor;

measuring a capacitance of the ferroelectric capacitor by referencing changes in the alternating current voltage signal in at least one of a positive and negative polarization state for the ferroelectric capacitor;

outputting a result of the measuring to a user as an indication of a polarization state of the ferroelectric capacitor representing a single data bit in the ferroelectric memory; and applying a direct current voltage signal to a ferroelectric capacitor to alter a polarization state of the ferroelectric capacitor, the capacitance of the ferroelectric capacitor being measured as the polarization state of the ferroelectric capacitor is altered by the direct current voltage signal.

20. The non-transitory computer-readable medium of claim 19, the applying the alternating current voltage signal and the measuring the capacitance being done wirelessly using at least one of inductive coupling and capacitive coupling.

* * * * *